Sept. 22, 1970 W. B. GOGGINS, JR 3,530,399

ULTRALINEAR SWEEP GENERATOR

Filed Nov. 26, 1968 2 Sheets-Sheet 1

INVENTOR.
WILLIAM B. GOGGINS Jr.

BY Harry A. Herbert Jr. and George Fine

ATTORNEYS

INVENTOR.
WILLIAM B. GOGGINS Jr.
BY Harry A. Herbert Jr. and George Fine
ATTORNEYS

United States Patent Office 3,530,399

Patented Sept. 22, 1970

3,530,399

ULTRALINEAR SWEEP GENERATOR

William B. Goggins, Jr., Winchester, Mass., assignor to the United States of America as represented by the Secretary of the Air Force Filed Nov. 26, 1968, Ser. No. 779,049
Int. Cl. H03b *3/04, 23/00*
U.S. Cl. 331—23 4 Claims

ABSTRACT OF THE DISCLOSURE

An ultralinear sweep generator is provided wherein a preselected sweep voltage is generated for application to a voltage controlled oscillator thus generating a nearly linear swept frequency signal. Deviations from linearity are sensed by a linearity detector. The linearity detector operates so that the frequency difference between the swept frequency signal and a delayed swept frequency signal is provided. If the swept frequency signal departs from linearity, the difference frequency is found and is compared to a reference frequency. This comparison causes a correction signal to be generated which is added to the original frequency control voltage for correction purposes to provide an ultralinear sweep signal.

BACKGROUND OF THE INVENTION

This invention relates to a sweep frequency generator and more particularly a sweep frequency generator wherein any departure from linearity of the swept frequency signal is detected and then fed back to correct for the aforesaid departure thus providing ultralinear operation.

Sweep generators, frequency scanned radars, pulse compression radars, and many other electronic components and systems require a perfectly swept frequency signal between well-defined limits. The requirement for an extremely linear swept frequency signal introduced additional problems including the range of frequencies, the sweep rate and sweep width. The present invention overcomes the prior art limitations by providing a technique and apparatus to generate an extremely linear sweep frequency signal. The technique is applicable to any frequency, to any practical sweep rate and to any practical sweep width.

SUMMARY OF THE INVENTION

In accordance with the present invention a linear (or nonlinear, if necessary) sweep voltage is applied to the frequency control terminal of a voltage controlled oscillator thus generating a nearly linear swept frequency signal. Deviations from linearity are sensed by a linearity detector. The linearity detector operates so that the frequency difference between the swept frequency signal and the swept frequency signal which has been slightly delayed is found. If the swept frequency departs from linearity, this difference frequency will be found. The difference frequency is compared with a reference frequency. This comparison causes a correction signal to be generated which is added to the original frequency control voltage. Thus there is provided a unique method of detecting the departure from linearity of the swept frequency signal, and the utilization of the departure for feedback to correct the frequency control voltage thereby solving the problem of generating an ultralinear swept frequency between well-defined limits. It is to be noted that the apparatus of the present invention can be used in any test or operating equipment requiring an extremely linear swept frequency. These uses include sweep generators, frequency scanned radars, and pulse compression radars.

An object of the present invention is to provide an ultraliner sweep generator.

Another object of the present invention is to provide an ultraliner sweep generator which includes a linearity detector for detection of a deviation from linearity.

Yet another object of the present invention is to provide an ultralinear sweep generator which detects deviation from linearity and then utilizes the detected deviation as a feedback signal for correction purposes.

The various features of novelty which characterize this invention are pointed out with particularity in the claims annexed to and forming a part of this specification. For a better understanding of this invention, however, its advantages and specific objects obtained with its use, reference should be had to the accompanying drawings and descriptive matter in which is illustrated and described a preferred embodiment of the invention.

DESCRIPTION OF THE PREFERRED EMBODIMENT

Figure 1:
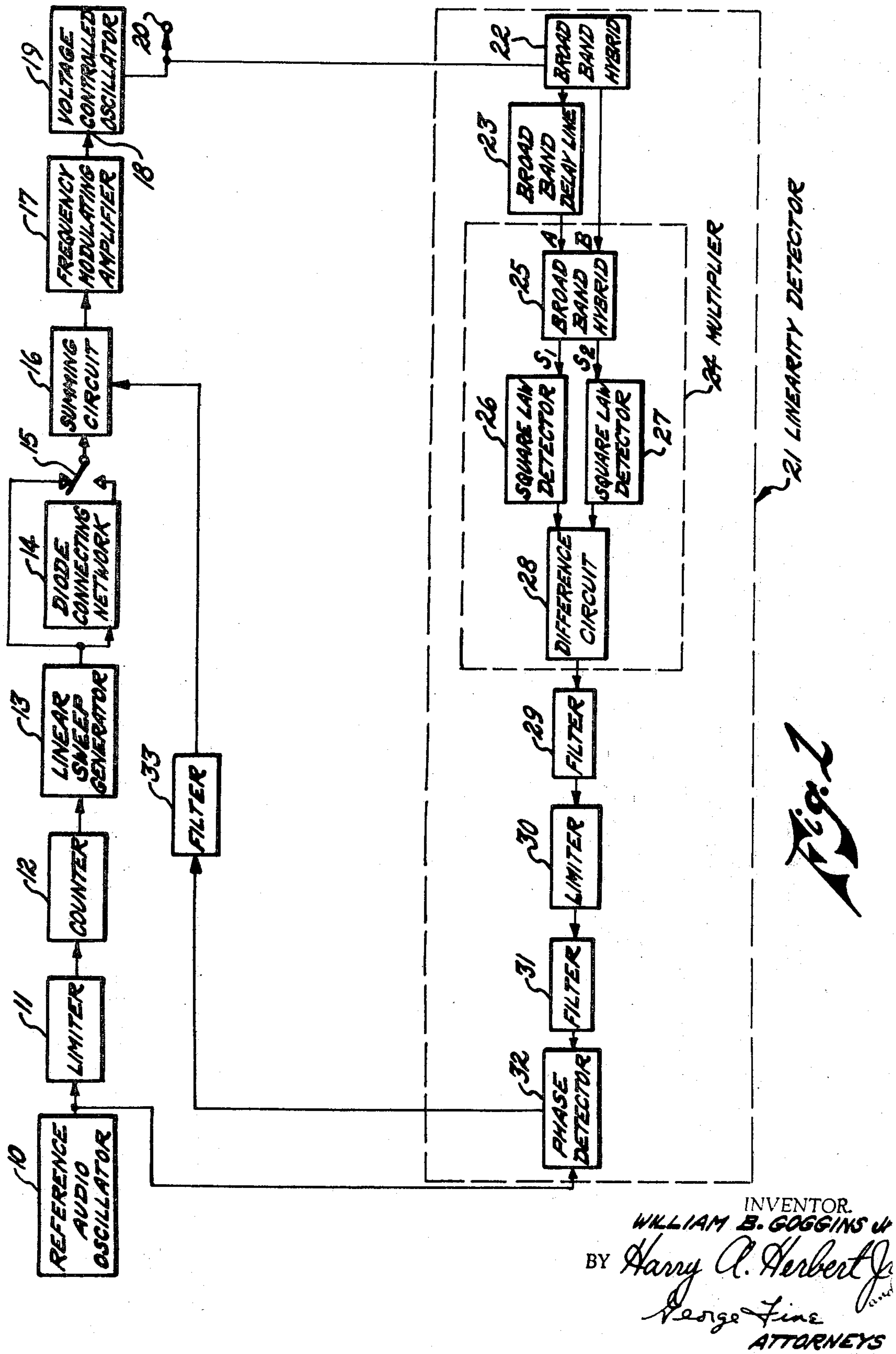
FIG. 1 illustrates a preferred embodiment of the invention in block diagram form.
Figures 2A, 2B, 2C:
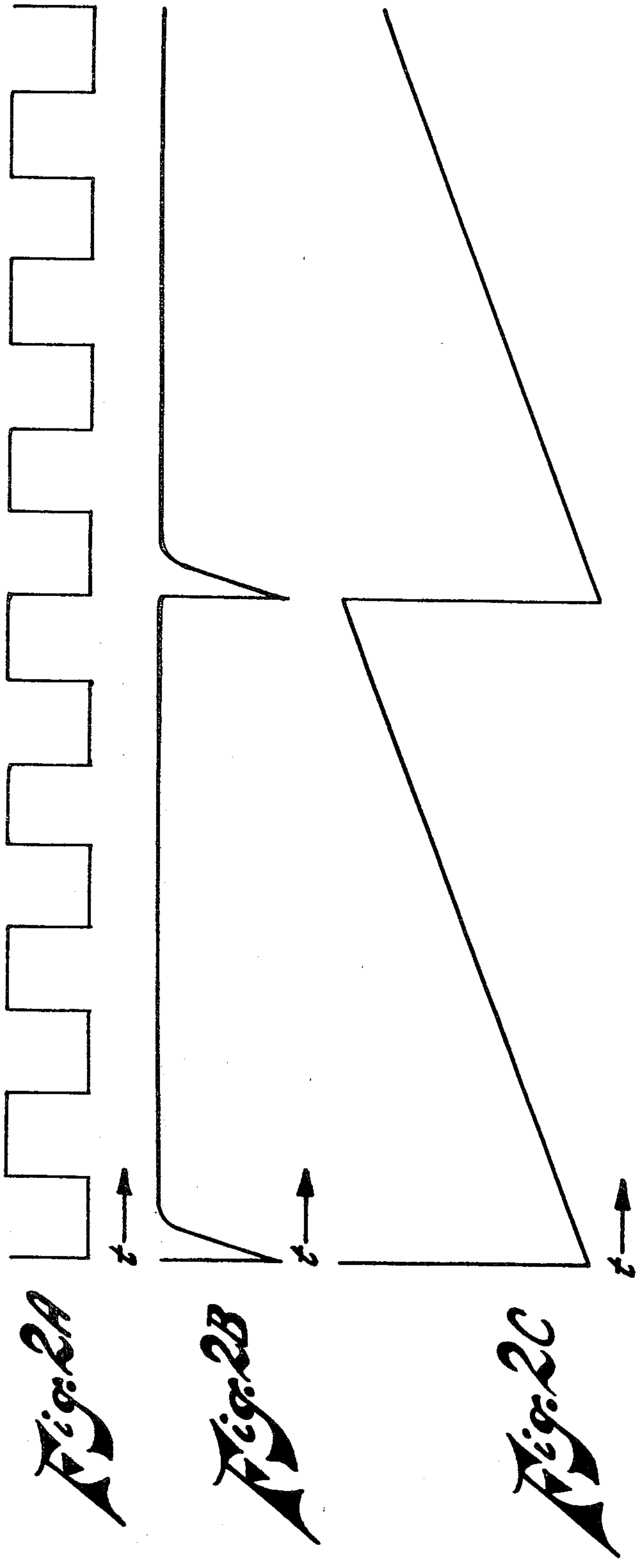
FIGS. 2A, 2B, and 2C show the output waveforms of the limiter, counter, and sweep generator included in FIG. 1.

Now referring to FIG. 1, there is provided variable reference audio oscillator 10 which generates an audio signal to control sweep rate and sweep width. As will be seen hereafter, it is necessary for the sweep width to be equal to an integral number of cycles of the audio signal. Limiter 10 receives the output of reference audio oscillator. Limiter 10 converts the sinusoidal audio signal to a square wave so that it can be accurately processed by counter 12. The output waveform of limiter 11 is shown at FIG. 2A.

Any conventional limiter which will generate a square wave with rise and fall time less than 2% of the period would be suitable. Counter 12 then counts an integral number of cycles and generates a timing signal which is used to recycle the linear sweep generator. The timing signal is shown at FIG. 2B. Any binary type counter with the proper output will be suitable. Linear sweep generator B produces an approximately linear sawtooth voltage between the counter pulses as shown in FIG. 2C. A Miller integrator is typical of the device which could be used. Any circuit which is capable of producing a linear sweep and being quickly recycled could be used.

If voltage controlled oscillator (VOC) 19 requires a highly nonlinear control voltage to produce an output linear in frequency, it may be necessary to correct the linear sweep with diode network 14. This is a *coarse* correction and is applied so that the sweep correcting signal will not have to be too large. Any network which will produce the necessary coarse correction would be suitable. Switch 15 is provided to permit the insertion of network 14 when required.

The purpose of summing circuit 16 is to add the sweep correcting voltage from linearity detector 21 to the coarse sweep voltage. Typical of this device is a summing amplifier. Any suitable summing circuit could be used.

Frequency modulating amplifier 17 provides any amplification to the sweep signal which may be necessary to properly control voltage controlled oscillator 19. This amplifier may even be the control circuits of the regulated power supply which supplies the VCO. Any suitable amplifier may be used.

Voltage controlled oscillator 19 produces an output whose frequency depends on the voltage applied to control terminal 18. A backward wave oscillator is a typical device at microwave frequencies. Any oscillator which is electrically turnable over the proper limits and at the desired rate may be used.

Figure 3:
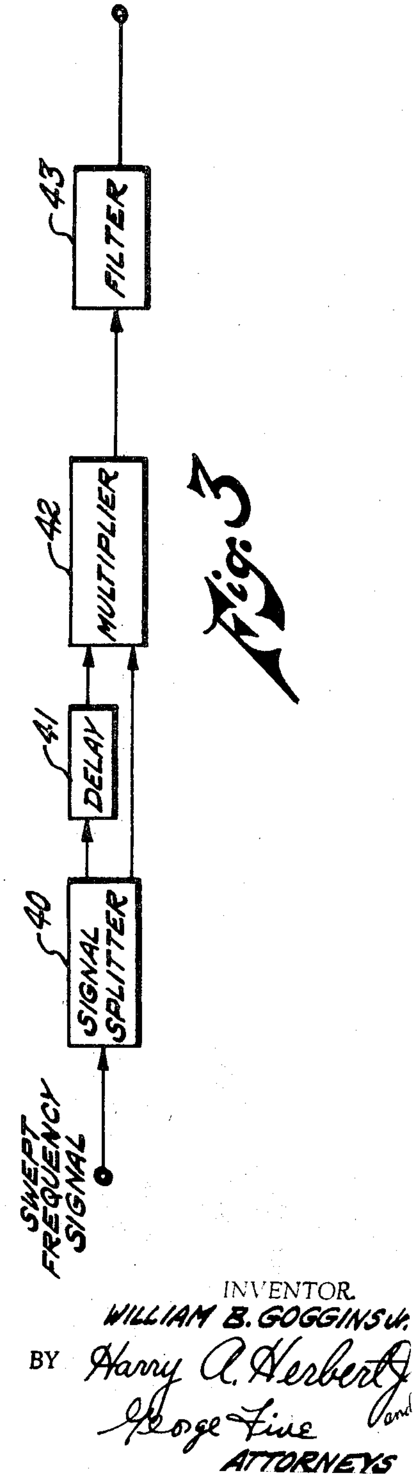
FIG. 3 is a block diagram of the apparatus to illustrate the general technique to provide linearity detection utilized in FIG. 1.

In order to properly describe the operation of linearity detector 21, a general explanation of the technique will be given. Consider FIG. 3.

A swept frequency signal is applied to signal splitter 40 where it is split in phase into two separate signals. One signal is fed directly to multiplier 42 while the other is delayed slightly by delay 41 and then fed to multiplier 42. At any time, $t$, the frequency of the signal fed directly is $\omega_1$. At the same instant, the frequency of the delayed signal is $$\alpha_2=\omega_1-\tau\frac{d\alpha}{dt} \quad (1)$$

where $\tau$ is the delay time and $d\alpha/dt$ is the sweep rate. The output of the multiplier is $$M=\cos\omega_1 t\cos\omega_2{}^t=\tfrac{1}{2}\cos(\omega_1-\omega_2)t+\tfrac{1}{2}\cos(\omega_1+\omega_2)t \quad (2)$$

If the high frequency term is filtered by filter 43, one is left with $$M=\tfrac{1}{2}\cos(\omega_1-\omega_2)t=\tfrac{1}{2}\cos\tau\frac{d\omega}{dt}t \quad (3)$$

As long as $d\omega/dt$ is linear, this is a constant frequency. As soon as $d\omega/dt$ departs from linearity, the frequency will change.

Now refer to FIG. 1 for a detailed explanation of linearity detector 21.

Broadband hybride 22 is used as a signal splitter because of its phase and isolation characteristics. However, any device which maintains phase to within +1 degree over the band would be suitable. One output is fed directly to multiplier 24 while the other goes to broadband delay 23 line.

Broadband delay line 23 delays the signal by an amount such that $$\tau=\frac{d\omega}{dt}$$

is equal to the reference oscillator frequency. This delay must be constant over the swept frequency. A length of transmission line would make a suitable delay line. However, any delay line of constant $\tau$ could be used.

Multiplier 24 shown consists of the components within the lines. The operation is as follows: The outputs of hybrid 25 are $$S_1=A+B \quad (4)$$

and $$S_2=A-B \quad (5)$$

These outputs are squared by two identical square law detectors 26 and 27

$$S_1{}^2=A^2+B^2+2AB \quad (6)$$
$$S_2{}^2=A^2+B^2-2AB$$

when $S_1{}^2$ and $S_2{}^2$ are substracted in difference circuit 28, we have $$S_1{}^2-S_2{}^2=4AB \quad (7)$$

Thus the circuit 24 performs the function of a multiplier. However, any suitable multiplier could be used.

The output of multiplier 24 is filtered by narrowband filter 29 to remove the high frequency components of the multiplier output. Any suitable narrowband filter could be used.

The signal is next passed through limiter 30 which removes any amplitude variation from the multiplier output. Any suitable frequency insensitive limiter may be used.

The audio signal is again filtered by filter 31 and passed to phase detector 32 where it is compared in phase with the reference audio oscillator signal. As long as the sweep is linear and at the proper rate, the output of multiplier 24 will be at the same frequency as the reference oscillator and phase detector 32 will produce zero output. However, if $d\omega/dt$ should depart from linearity, the multiplier output will tend to change in frequency and thus in phase and phase detector 32 will generate an output which will be added to the sweep voltage and will correct the sweep back to linearity. Thus a phase lock loop is formed.

Filter 33 is necessary for proper operation of the phase lock loop and its characteristics are determined by the operating parameters of the device.

It should be pointed out that it is also possible to use a linear triangular sweep with the above system. In addition to other features of the invention. The limits of the swept frequency output will be well defined.

While particular embodiments of the present invention have been shown and described, it is apparent that various changes and modifications may be made, and it is therefore contemplated in the appended claims to cover all such changes and modifications as fall within the true spirit and scope of the invention.

What is claimed is:

1. An ultralinear sweep generator comprising an audio oscillator operating at a preselected frequency, means to convert the sinusoidal audio signal of said audio oscillator to a square wave signal, means receiving said square wave signal and operating to count an integral number of cycles to provide a timing signal, means to generate a sweep voltage of a predetermined width and rate in accordance with said timing signal applied to said sweep generator, a summing circuit having first and second inputs, said summing circuit receiving at said first input the output of said sweep generator, a voltage controlled oscillator having a frequency control terminal receiving said generated sweep voltage by way of said summing network, means to split the output signal from said oscillator into a pair of signals, means to delay for a predetermined period one of said pair of signals, means to multiply said delayed signal against the undelayed signal of said pair, a phase detector, preselected filter means interconnecting said multiplier and said phase detector, said phase detector also receiving the output of said audio oscillator, and second preselected filter means interconnecting the output of said phase splitter and said second input of said summing circuit.

2. An ultralinear sweep generator as described in claim 1 wherein said splitting means is comprised of a broadband hybrid.

3. An ultralinear sweep generator as described in claim 1 wherein said multiplying means is comprised of first and second square law detectors, the first of said detectors receiving the delayed signal and the second, the undelayed signal, and a difference circuit receiving the outputs of said first and second square law detectors.

4. An ultralinear sweep generator as described in claim 1 further including a limiter and a second filter, respectively, between said interconnecting filter and said phase detector.

References Cited

UNITED STATES PATENTS

| | | | |
|---|---|---|---|
| 3,379,976 | 4/1968 | Niederer | 331—178 X |
| 3,382,460 | 5/1968 | Blitz et al. | 331—178 |

ROY LAKE, Primary Examiner

S. H. GRIMM, Assistant Examiner

U.S. Cl. X.R.

331—25, 178